(12) United States Patent
Tsao (10) Patent No.: US 12,526,963 B2
(45) Date of Patent: Jan. 13, 2026

(54) HEAT DISSIPATION MODULE

(71) Applicant: Lite-On Technology Corporation, Taipei (TW)

(72) Inventor: Chien-Hsiung Tsao, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 219 days.

(21) Appl. No.: 18/534,733

(22) Filed: Dec. 11, 2023

(65) Prior Publication Data

US 2025/0151238 A1 May 8, 2025

(30) Foreign Application Priority Data

Nov. 7, 2023 (TW) ................................. 112142839

(51) Int. Cl.
*H05K 7/20* (2006.01)
*H01F 27/02* (2006.01)
(Continued)

(52) U.S. Cl.
CPC ....... *H05K 7/20472* (2013.01); *H01F 27/025* (2013.01); *H01G 2/08* (2013.01); *H01L 23/3735* (2013.01)

(58) Field of Classification Search
CPC .......... H05K 7/00; H05K 7/20; H05K 7/2039; H05K 7/20472; H05K 7/2049; H05K 7/20409–20418; H05K 7/20154; H05K 7/20509; H05K 2201/10166; H01L 23/34; H01L 23/367; H01L 23/3672; H01L 23/3677; H01L 23/3735; H01L 23/40–4006; H01L 23/4093; H01L 23/4081; H01L 23/4087; H01L 23/467; H01L 23/405; H01L 2023/4062;
(Continued)

(56) References Cited

U.S. PATENT DOCUMENTS 6,185,101 B1 2/2001 Itabashi et al.
6,190,941 B1 * 2/2001 Heinz ................. H05K 3/0094
438/106
(Continued)

FOREIGN PATENT DOCUMENTS

CN 1226129 8/1999
CN 103547117 1/2014
(Continued)

OTHER PUBLICATIONS

CN-116487339-A English Translation (Year: 2023).*
(Continued)

*Primary Examiner* — Amir A Jalali
(74) *Attorney, Agent, or Firm* — JCIPRNET (57) ABSTRACT

A heat dissipation module including an electronic component, a first heat dissipation component and a first thermal adhesive sheet, is provided. The electronic component has a first surface. The first heat dissipation component has a second surface facing the first face. The first thermal adhesive sheet is disposed between the first surface of the electronic component and the second surface of the first heat dissipation component, so as to fix the first heat dissipation component to the electronic component. Another heat dissipation module is also provided.

7 Claims, 7 Drawing Sheets

(51) Int. Cl.
*H01G 2/08* (2006.01)
*H01L 23/373* (2006.01)

(58) Field of Classification Search
CPC ..... H01L 2023/4037; H01L 2023/4075–4087; G06F 1/16; G06F 1/20; G06F 1/203; H01F 27/025; H01G 2/08; F28F 13/06; F28F 3/02; F28D 15/02; H01H 9/52
See application file for complete search history.

(56) References Cited

U.S. PATENT DOCUMENTS

| | | | |
|---|---|---|---|
| 8,730,670 B1 | 5/2014 | Zohni et al. | |
| 9,001,513 B2* | 4/2015 | Pan | H01L 23/4006 174/15.1 |
| 9,351,424 B2* | 5/2016 | Facusse | H05K 7/20809 |
| 11,621,211 B2* | 4/2023 | Hsieh | H01L 23/3672 257/717 |
| 2004/0146707 A1* | 7/2004 | Machida | H01L 23/3735 428/328 |
| 2007/0086165 A1* | 4/2007 | Nakajima | H05K 7/20436 257/E23.102 |
| 2008/0080140 A1* | 4/2008 | Hsieh | H01L 23/4006 257/E23.084 |
| 2010/0019380 A1* | 1/2010 | Lin | H01L 23/467 257/E23.08 |
| 2012/0192574 A1* | 8/2012 | Ghoshal | F25B 21/02 62/3.2 |
| 2013/0105964 A1* | 5/2013 | Seki | H01L 23/4093 257/E23.08 |
| 2014/0022731 A1 | 1/2014 | Chen et al. | |
| 2014/0307390 A1* | 10/2014 | Baker | H01L 23/42 361/709 |
| 2016/0233145 A1* | 8/2016 | Caroff | H01L 23/3672 |
| 2021/0400815 A1* | 12/2021 | Salvatore | H05K 7/209 |
| 2023/0386987 A1* | 11/2023 | Bu | H01L 25/115 |

FOREIGN PATENT DOCUMENTS

| | | | | |
|---|---|---|---|---|
| CN | 104918455 B | * | 10/2017 | ......... H05K 7/14324 |
| CN | 116487339 A | * | 7/2023 | ........... H01L 23/367 |
| CN | 119092499 A | * | 12/2024 | ............. H01L 24/82 |
| KR | 101205093 | | 11/2012 | |
| TW | M391271 | | 10/2010 | |

OTHER PUBLICATIONS

CN-119092499-A English Translation (Year: 2024).*
CN-104918455-B English Translation (Year: 2017).*
"Office Action of Taiwan Counterpart Application", issued on Aug. 7, 2024, p. 1-p. 8.

* cited by examiner

HEAT DISSIPATION MODULE

CROSS-REFERENCE TO RELATED APPLICATION

This application claims the priority benefit of Taiwan application serial no. 112142839, filed on Nov. 7, 2023. The entirety of the above-mentioned patent application is hereby incorporated by reference herein and made a part of this specification.

BACKGROUND

Technical Field

The disclosure relates to a heat dissipation module, and particularly relates to a heat dissipation module that provides bonding for an entire surface area through a thermal adhesive sheet.

Description of Related Art

Generally, a heat dissipation component (such as heat dissipation fins) in electronic products is connected to a heat-generating electronic component to dissipate heat generated from the electronic component. Often, the heat dissipation component and the electronic component are locked together with screws or nuts. However, this method for fixation is likely to produce metal shavings or burrs during the assembly process, or to be improperly fastened, thereby affecting the electrical properties and heat dissipation performance of the electronic product. Alternatively, some electronic products apply liquid glue at local spots of a to-be-fixed component as a means of fixation. However, this type of glue flows easily, making it difficult to control the flow direction and glue thickness, and causing non-uniform adhesion on the contact surface and inconsistent adhesive quality. Curing for the glue is also time-consuming, making it difficult to improve production efficiency.

SUMMARY

The disclosure provides a number of heat dissipation modules, which have good electrical properties and heat dissipation performance, reduced assembly time, and good adhesive quality.

A heat dissipation module of the disclosure includes an electronic component, a first heat dissipation component and a first thermal adhesive sheet. The electronic component has a first surface. A first heat dissipation component has a second surface facing the first surface. A first thermal adhesive sheet is disposed between the first surface of the electronic component and the second surface of the first heat dissipation component, so as to fix the first heat dissipation component to the electronic component.

In an embodiment of the disclosure, an area of the first thermal adhesive sheet is greater than an area of the first surface of the electronic component, or/and the area of the first thermal adhesive sheet is greater than an area of the second surface of the first heat dissipation component.

In an embodiment of the disclosure, the heat dissipation module further includes a second heat dissipation component and a second thermal adhesive sheet. The electronic component has a third surface, and the second heat dissipation component has a fourth surface facing the third surface. The second thermal adhesive sheet is disposed between the fourth surface of the second heat dissipation component and the third surface of the electronic component, so as to fix the second heat dissipation component to the electronic component.

In an embodiment of the disclosure, an area of the second thermal adhesive sheet is greater than an area of the third surface of the electronic component, or/and the area of the second thermal adhesive sheet is greater than an area of the fourth surface of the second heat dissipation component.

In an embodiment of the disclosure, a thickness of the first thermal adhesive sheet is between 0.02 mm and 0.2 mm.

In an embodiment of the disclosure, the electronic component is a chip.

In an embodiment of the disclosure, the electronic component is a capacitance component or an inductance component.

Another heat dissipation module of the disclosure includes a first heat dissipation component, a second heat dissipation component, a third heat dissipation component and two first thermal adhesive sheets. A first heat dissipation component has a first surface. A second heat dissipation component includes a first plate body and a plurality of first fins protruding from the first plate body. One of the first fins has a second surface facing the first surface. A third heat dissipation component includes a second plate body and a plurality of second fins protruding from the second plate body. One of the second fins has a third surface facing the first surface. Two first thermal adhesive sheets are respectively disposed between the second surface of the second heat dissipation component and the first surface of the first heat dissipation component and between the third surface of the third heat dissipation component and the first surface of the first heat dissipation component, so as to fix the first heat dissipation component to the second heat dissipation component and the third heat dissipation component.

In an embodiment of the disclosure, the heat dissipation module further includes at least one first electronic component and at least one second electronic component. The first plate body of the second heat dissipation component has a fourth surface and a fifth surface opposite to each other. The second plate body of the third heat dissipation component has a sixth surface and a seventh surface opposite to each other. The at least one first electronic component is disposed on at least one of the fourth surface and the fifth surface, and the at least one second electronic component is disposed on at least one of the sixth surface or the seventh surface.

In an embodiment of the disclosure, the heat dissipation module further includes a plurality of second thermal adhesive sheets. One of the second thermal adhesive sheets is disposed on at least one of the fourth surface and the fifth surface of the first plate body of the second heat dissipation component, so as to fix the at least one first electronic component to the second heat dissipation component. Another one of the second thermal adhesive sheets is disposed on at least one of the sixth surface and the seventh surface of the second plate body of the third heat dissipation component, so as to fix the at least one second electronic component to the third heat dissipation component.

In an embodiment of the disclosure, an area of the second thermal adhesive sheets is greater than an area of the fourth surface or the fifth surface of the first plate body of the second heat dissipation component, or/and the area of the second thermal adhesive sheet is greater than an area of the sixth surface or the seventh surface of the second plate body of the third heat dissipation component.

In an embodiment of the disclosure, at least one of the first electronic component and the second electronic component is a chip.

In an embodiment of the disclosure, at least one of the first electronic component and the second electronic component is a capacitance component or an inductance component.

In an embodiment of the disclosure, an area of the first thermal adhesive sheet is greater than a projection area of the second surface of the second heat dissipation component on the first surface of the first heat dissipation component, or/and the area of the first thermal adhesive sheet is greater than a projection area of the third surface of the third heat dissipation component on the first surface of the first heat dissipation component.

In an embodiment of the disclosure, a thickness of the first thermal adhesive sheet is between 0.02 mm and 0.2 mm.

Based on the above description, the first heat dissipation component of the heat dissipation module in the disclosure is fixed to the electronic component through the first thermal adhesive sheet. The first thermal adhesive sheet provides bonding for an entire surface area, uniform adhesion, large adhesive area and thus great fixation. Moreover, no metal shavings or burrs will be produced during the fixation process, and improper tightening seen in conventional locking methods can be avoided, thereby ensuring normal electrical properties and heat dissipation performance of the heat dissipation module. Further, compared with conventional liquid glue dispensing, the fixation process of the first thermal adhesive sheet in the disclosure saves time and is conducive to mass production. Furthermore, the second heat dissipation component and the third heat dissipation component in the heat dissipation module are firmly fixed to the first heat dissipation component through the first thermal adhesive sheet, so that the first electronic component disposed on the second heat dissipation component and the second electronic component disposed on the third heat dissipation component dissipate heat through not only the second heat dissipation component and the third heat dissipation component but the first heat dissipation component, thereby improving the heat dissipation performance of the heat dissipation module.

DESCRIPTION OF THE EMBODIMENTS

Reference will now be made in detail to the exemplary embodiments of the disclosure, examples of which are illustrated in the accompanying drawings. Wherever possible, the same reference numerals are used in the drawings and descriptions to refer to the same or like parts.

Figure 1A:
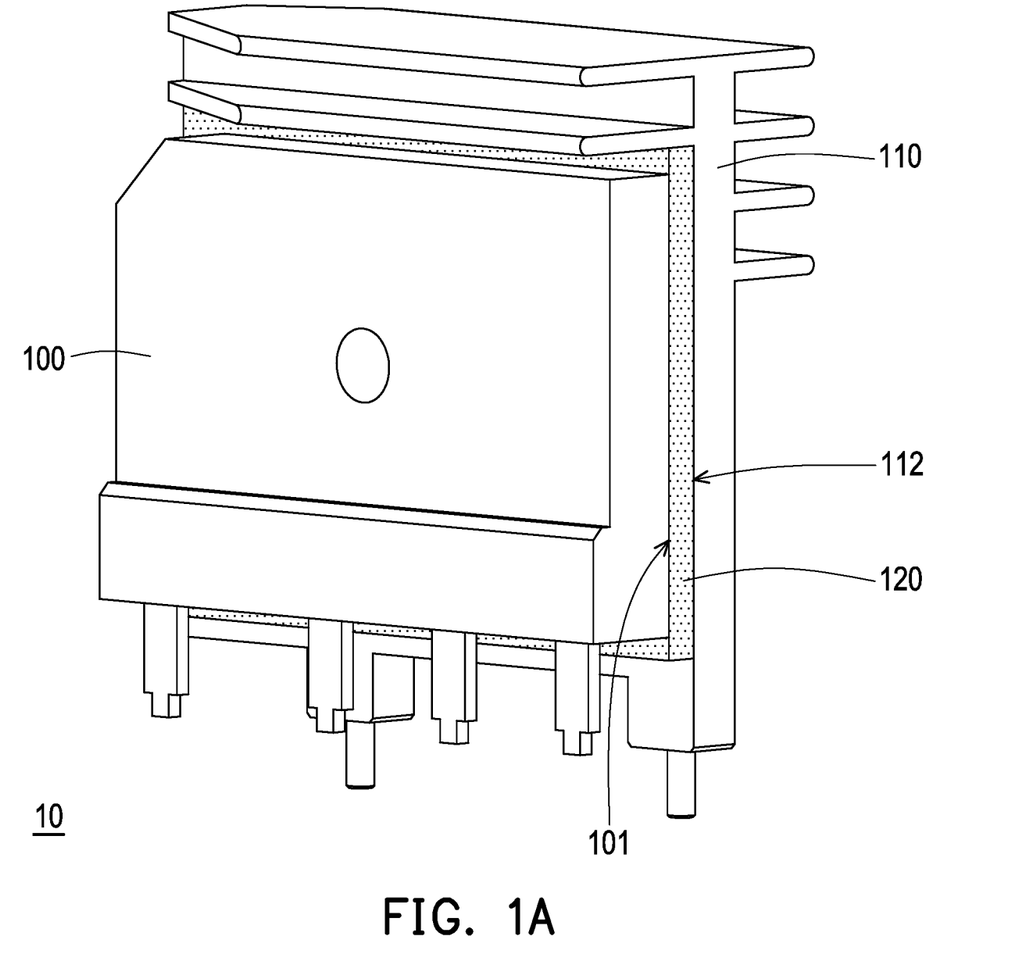
FIG. 1A is a three-dimensional view of a heat dissipation module according to an embodiment of the disclosure.
Figure 1B:
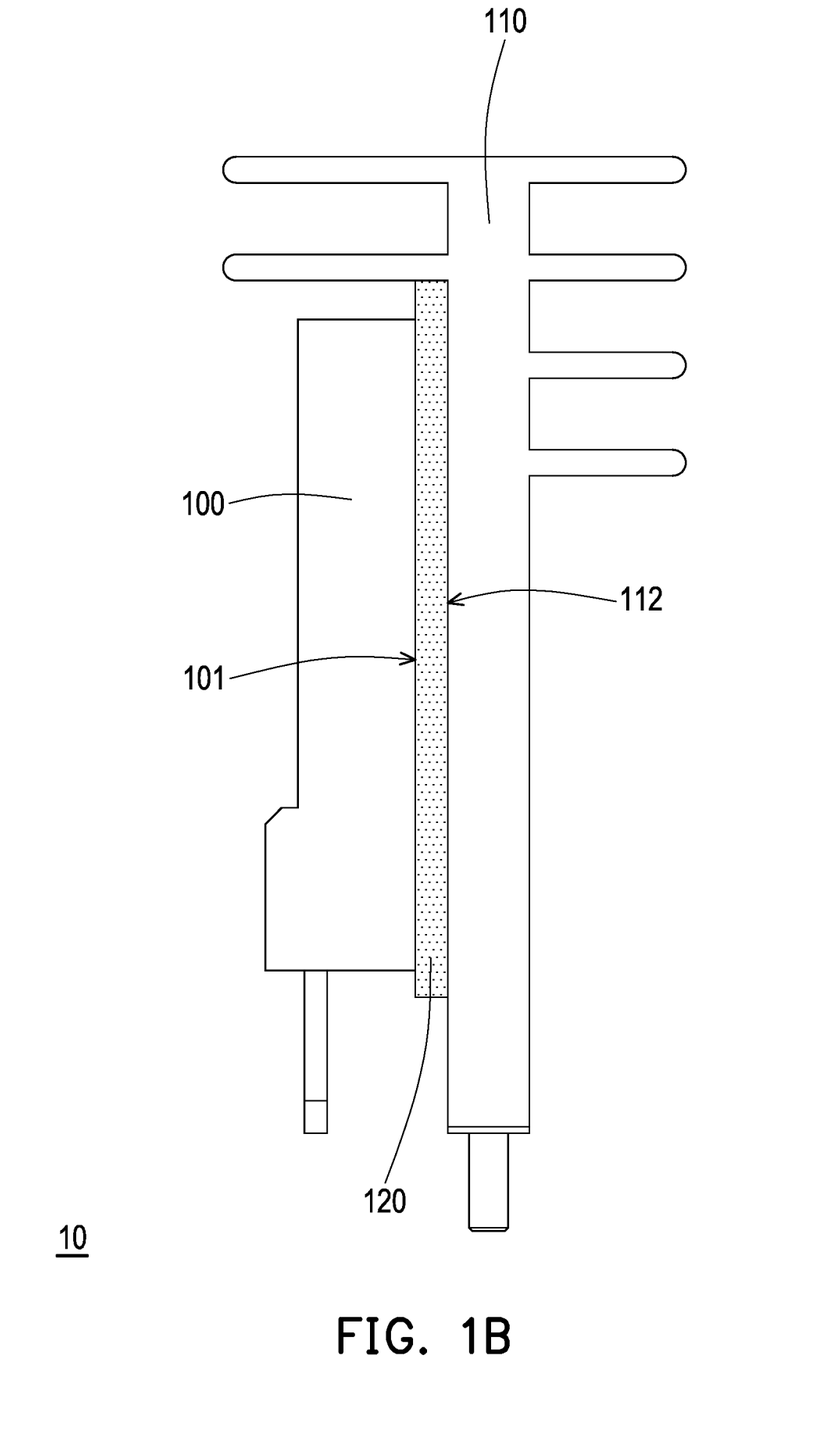
FIG. 1B is a side view of the heat dissipation module of FIG. 1A.

FIG. 1A is a three-dimensional view of a heat dissipation module according to an embodiment of the disclosure. FIG. 1B is a side view of the heat dissipation module of FIG. 1A. Referring to FIG. 1A and FIG. 1B, the heat dissipation module 10 in this embodiment includes an electronic component 100, a first heat dissipation component 110 and a first thermal adhesive sheet 120. The heat dissipation module 10 may be applied in the fields of electronic communication, power supply and microgrids, but the fields of application for the heat dissipation module 10 are not limited thereto.

The electronic component 100 is, for example, a chip, a capacitance component, or an inductance component, but the type of the electronic component 100 is not limited thereto. The first heat dissipation component 110 is, for example, a heat sink with heat dissipation fins and used to dissipate heat from the heat-generating electronic component 100. Of course, the type of the first heat dissipation component 110 is not limited thereto.

In this embodiment, the first heat dissipation component 110 is fixed to the electronic component 100 through the first thermal adhesive sheet 120, and the heat of the electronic component 100 may be dissipated through the first heat dissipation component 110 by the first thermal adhesive sheet 120.

The method of fixing the first heat dissipation component 110 to the electronic component 100 will be illustrated below. First, the electronic component 100 has a first surface 101, and the first heat dissipation component 110 has a second surface 112 facing the first surface 101. The material of the first thermal adhesive sheet 120 is, for example, pressure sensitive adhesive (PSA). The first thermal adhesive sheet 120 is first disposed in a pressing manner between the first surface 101 of the electronic component 100 and the second surface 112 of the first heat dissipation component 110, and is then briefly heated at high temperature. This allows first thermal adhesive sheet 120 to be cured to fix the first heat dissipation component 110 to the electronic component 100.

In conventional fixation methods, screws or nuts are often used to lock a heat dissipation component to an electronic component. However, metal shavings or burrs may be easily produced during the locking process, which may affect the electrical properties of the electronic component 100 and lower the heat dissipation performance due to improper tightening.

Additionally, there are also conventional methods where the heat dissipation component is locally adhered to the electronic component by liquid glue dispensing. However, this type of glue has high fluidity, making it difficult to control the flow direction and glue thickness during the fixation process, thereby affecting the adhesive quality and aesthetic appearance. Moreover, curing for this type of colloid is time-consuming, resulting in low production efficiency. In addition, this type of glue is dot-dispensed on local areas of a to-be-fixed component. Such adhesion is likely to be non-uniform and the adhesive area is small, and gaps may be easily formed between two to-be-fixed components, resulting in poor adhesive quality.

In contrast, the material of the first thermal adhesive sheet 120 in the disclosure is heat-sensitive adhesive that is resistant to flow at normal temperature, so the adhesive range and thickness can be easily controlled. Meanwhile, the first thermal adhesive sheet 120 provides bonding for the entire surface area and uniform adhesion without creating gaps, thereby achieving excellent adhesive quality and aesthetic appearance. The thickness of the first thermal adhesive sheet 120 is between 0.02 mm and 0.2 mm, which is very thin and light. After the first thermal adhesive sheet 120 is disposed between the first surface 101 of the electronic component 100 and the second surface 112 of the first heat dissipation component 110, it may be cured after a short period of heating at high-temperature. The time for curing is short, and hence the production time is reduced.

In addition, thermal-sensitive adhesive also provides excellent electrical insulation and thermal conductivity. Taking this embodiment as an example, the thermal conductivity of the first thermal adhesive sheet 120 is between 3 W/m K and 4 W/m K, achieving good thermal conductivity.

In addition, the area of the first thermal adhesive sheet 120 in this embodiment is larger than the area of the first surface 101 of the electronic component 100, or/and the area of the first thermal adhesive sheet 120 is larger than the area of the second surface 112 of the first heat dissipation component 110. area, so that the first thermal adhesive sheet 120 is well disposed between the electronic component 100 and the first heat dissipation component 110, ensuring good adhesion.

Figure 2A:
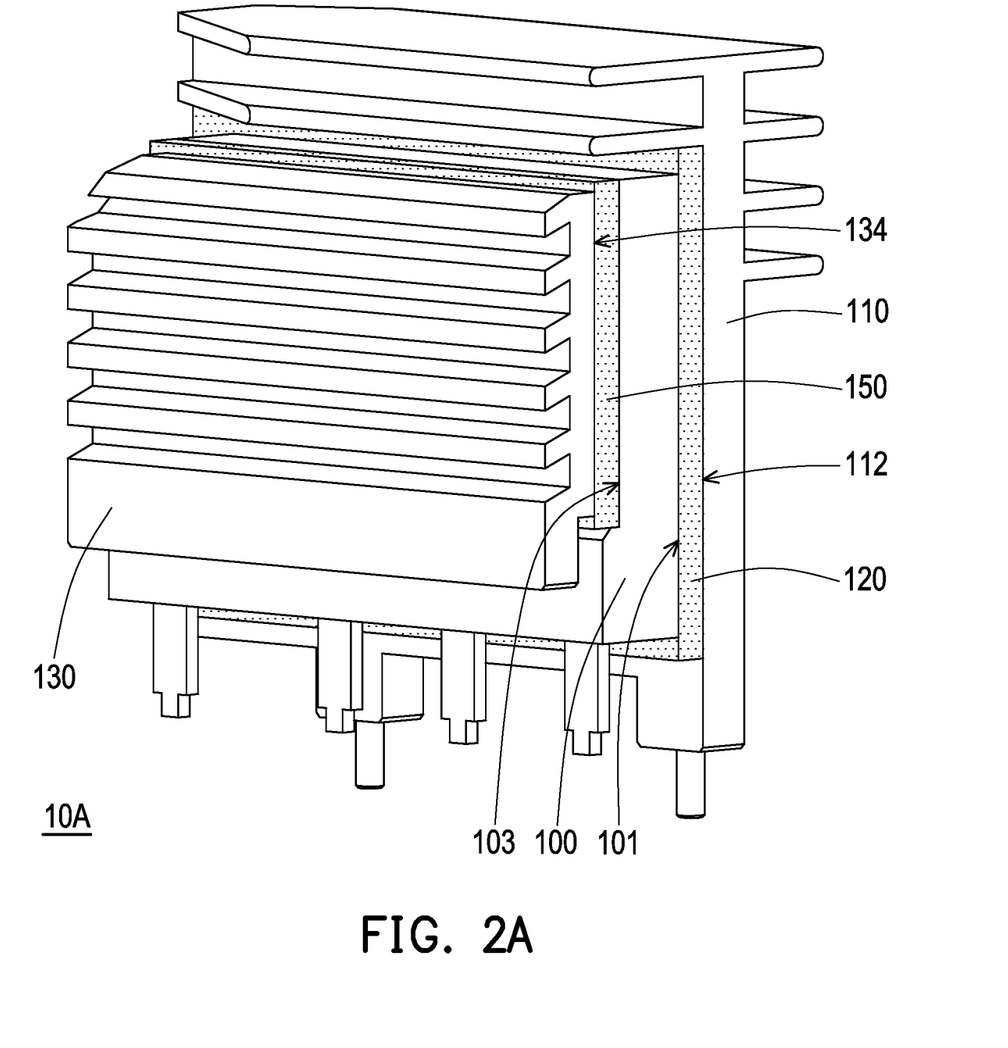
FIG. 2A is a three-dimensional view of a heat dissipation module according to another embodiment of the disclosure.
Figure 2B:
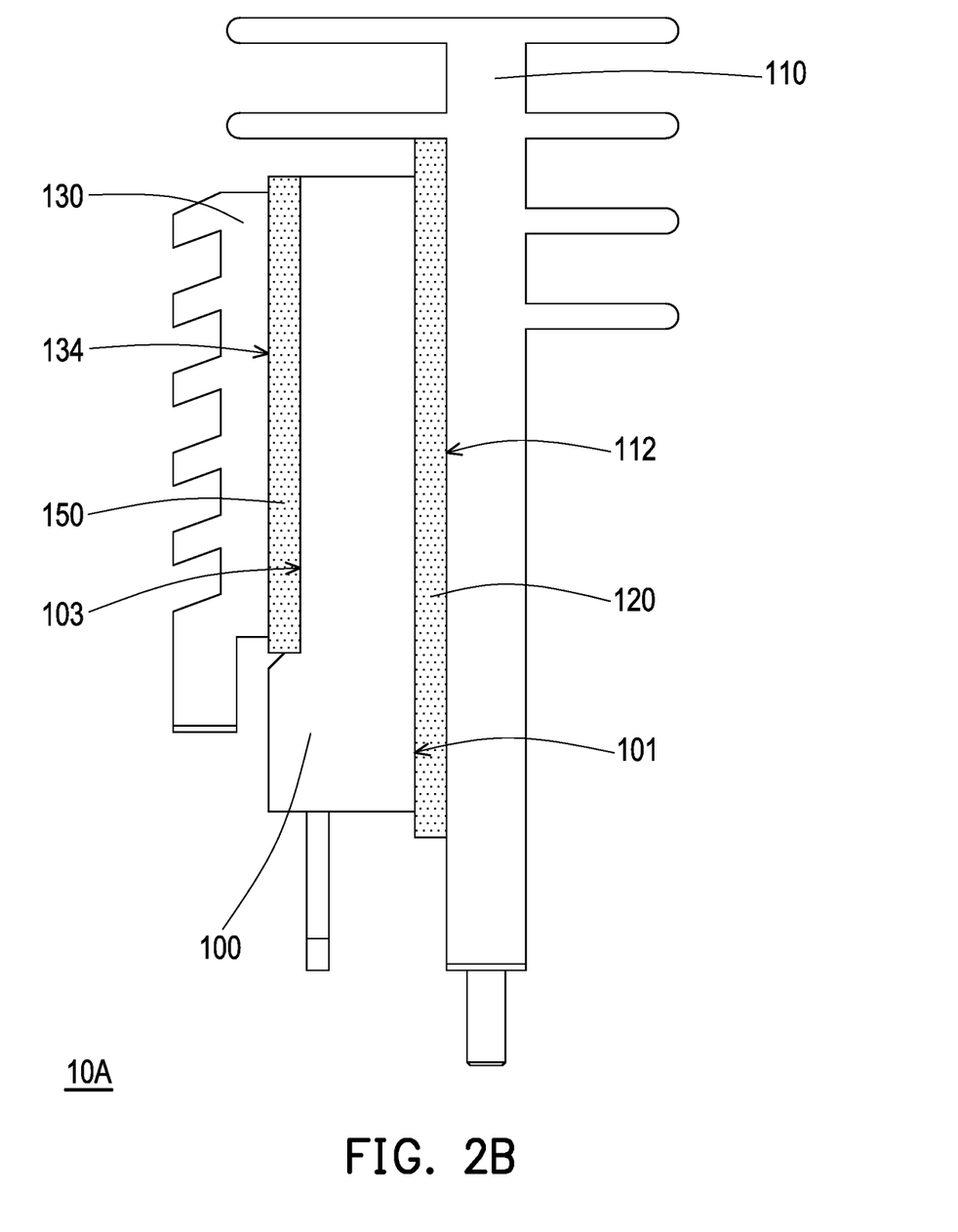
FIG. 2B is a side view of the heat dissipation module of FIG. 2A.

FIG. 2A is a three-dimensional view of a heat dissipation module according to another embodiment of the disclosure. FIG. 2B is a side view of the heat dissipation module of FIG. 2A. A main difference between the embodiment shown in FIG. 2A and the embodiment shown in FIG. 1A is that the heat dissipation module 10A in FIG. 2A further includes a second heat dissipation component 130 and a second thermal adhesive sheet 150.

Referring to FIG. 2A and FIG. 2B, specifically, the electronic component 100 has a third surface 103. The second heat dissipation component 130 is, for example, a heat sink including heat dissipation fins, and has a fourth surface 134 facing the third surface 103. The second thermal adhesive sheet 150 is disposed between the fourth surface 134 of the second heat dissipation component 130 and the third surface 103 of the electronic component 100 to fix the second heat dissipation component 130 to the electronic component 100, thereby further improving the heat dissipation capability of the heat dissipation module 10A on the electronic component 100.

In this embodiment, the material of the first thermal adhesive sheet 120 and the second thermal adhesive sheet 150 are both the aforementioned heat-sensitive adhesive, which has excellent adhesive quality, electrical insulation and thermal conductivity and is conducive to save production time.

In addition, the area of the second thermal adhesive sheet 150 in this embodiment is larger than the area of the fourth surface 134 of the second heat dissipation component 130, or/and the area of the second thermal adhesive sheet 150 is larger than the area of the third surface 103 of the electronic component 100. area, so that the second thermal adhesive sheet 150 is well disposed between the electronic component 100 and the second heat dissipation component 130, ensuring good adhesion.

Figure 3A:
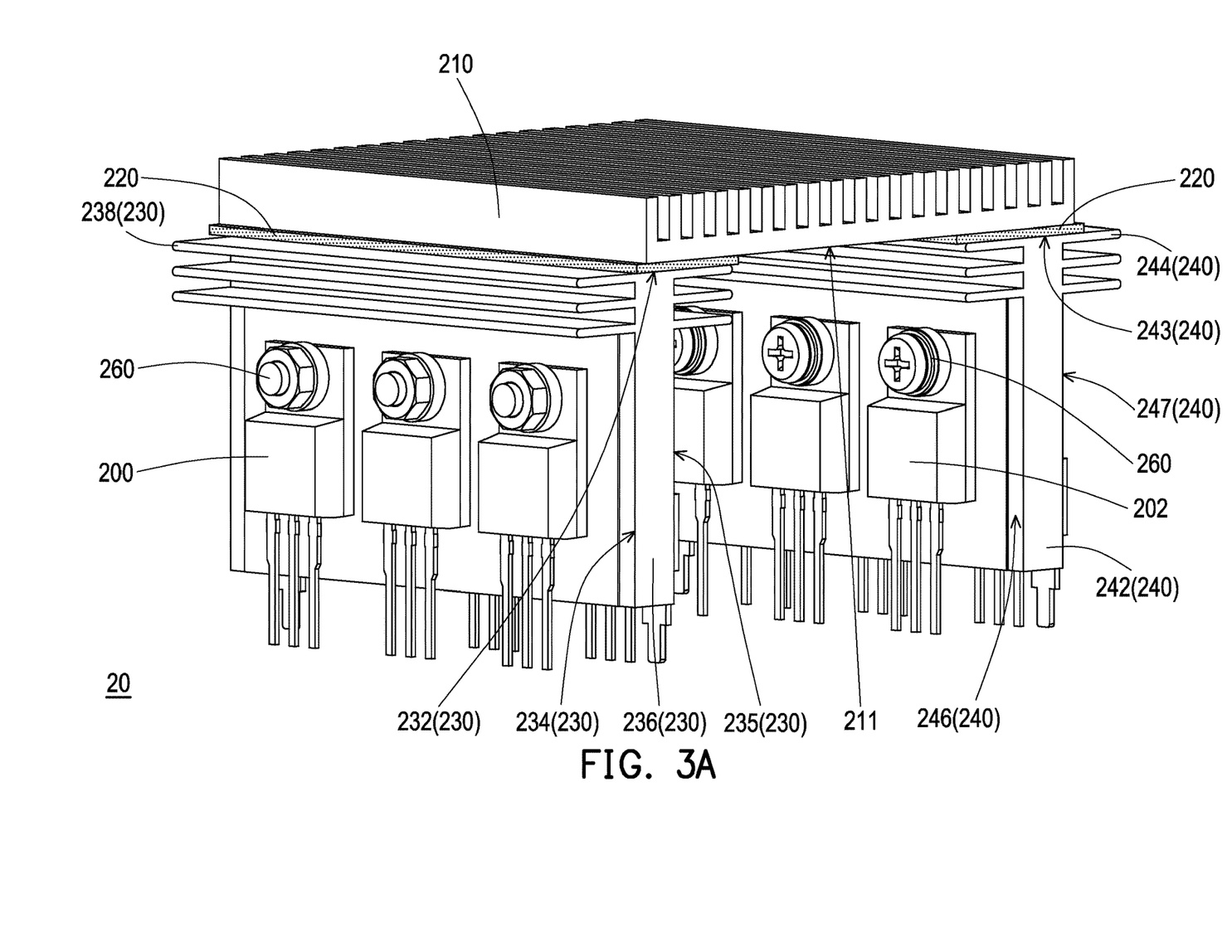
FIG. 3A is a three-dimensional view of a heat dissipation module according to another embodiment of the disclosure.
Figure 3B:
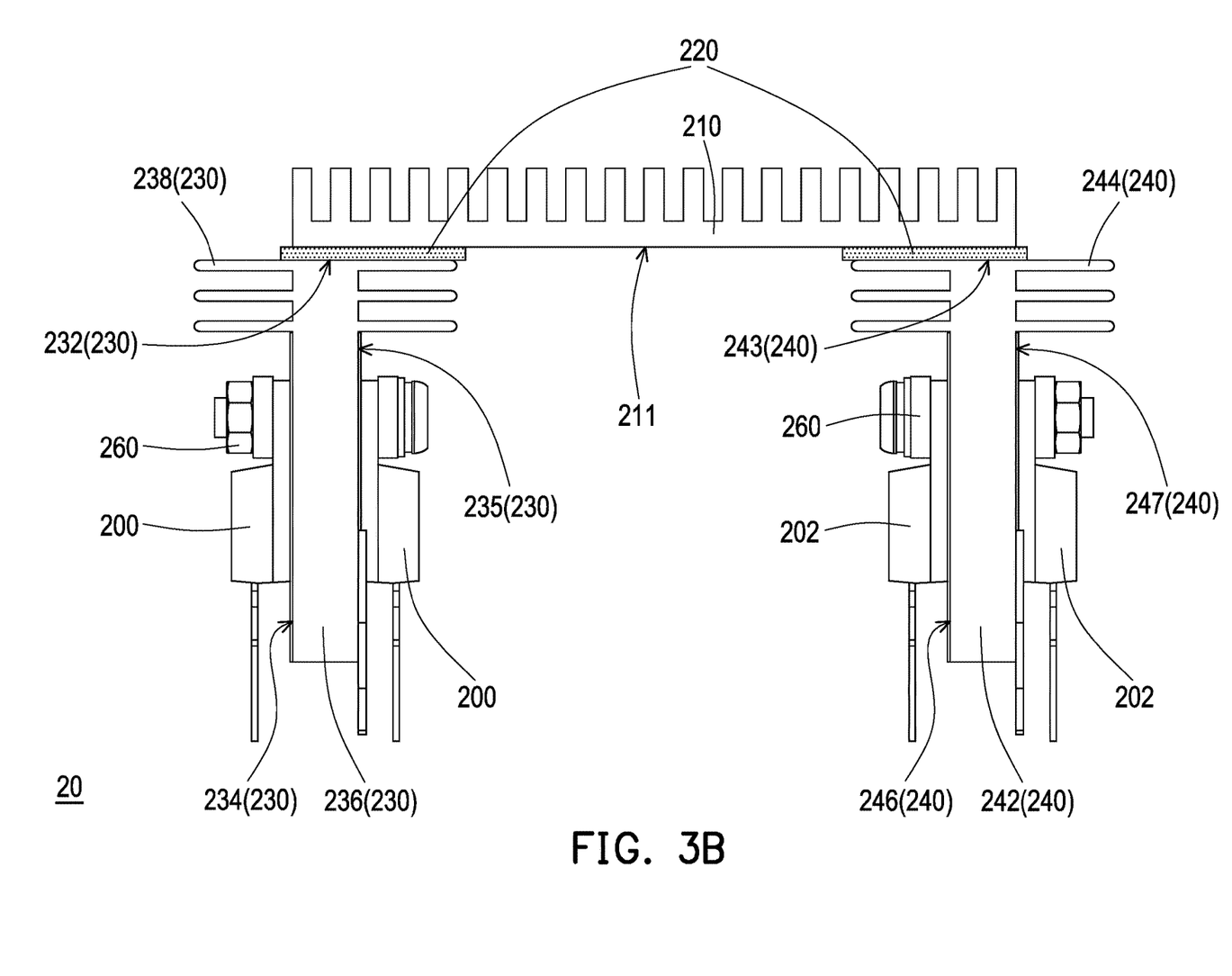
FIG. 3B is a side view of the heat dissipation module of FIG. 3A.

FIG. 3A is a three-dimensional view of a heat dissipation module according to another embodiment of the disclosure. FIG. 3B is a side view of the heat dissipation module of FIG. 3A. Referring to FIG. 3A and FIG. 3B, the heat dissipation module 20 includes a first heat dissipation component 210, a second heat dissipation component 230, at least one first electronic component 200, at least one second electronic component 202, and a third heat dissipation component 240 and two first thermal adhesive sheets to dissipate heat generated from the first electronic component 200 and the second electronic component 202.

Referring to FIG. 3A and FIG. 3B, specifically, the first heat dissipation component 210 is, for example, a heat sink having heat dissipation fins, and has a first surface 211. The second heat dissipation component 230 includes a first plate body 236 and a plurality of first fins 238 protruding from the first plate body 236.

The second heat dissipation component 230 is, for example, T-shaped. The first plate body 236 is perpendicular to the first fins 238, the first fins 238 is parallel to the first surface 211, and one of the first fins 238 has a second surface 232 facing the first surface 211. The third heat dissipation component 240 includes a second plate body 242 and a plurality of second fins 244 protruding from the second plate body 242. The third heat dissipation component 240 is, for example, T-shaped. The second plate body 242 is perpendicular to the second fins 244. The second fins 244 are parallel to the first surface 211, and one of the second fins 244 has a third surface of 243 facing the first surface 211.

The second heat dissipation component 230 and the third heat dissipation component 240 in this embodiment are heat dissipation components of the same type. In other embodiments, the second heat dissipation component 230 and the third heat dissipation component 240 may be different types of heat dissipation components.

In this embodiment, the first plate body 236 of the second heat dissipation component 230 has a fourth surface 234 and a fifth surface 235 opposite to each other, and the fourth surface 234 and the fifth surface 235 are perpendicular to the first surface 211 of the first heat dissipation component 210. The second plate body 242 of the third heat dissipation component 240 has a sixth surface 246 and a seventh surface 247 opposite to each other, and the sixth surface 246 and the seventh surface 247 are perpendicular to the first surface 211 of the first heat dissipation component 210.

The first electronic component 200 is disposed on at least one of the fourth surface 234 and the fifth surface 235 through a locking assembly 260, and the second electronic component 202 is disposed on at least one of the sixth surface 246 and the seventh surface 247 through the locking assembly 260. Hence, the first electronic component 200 and the second electronic component 202 may dissipate heat through the second heat dissipation component 230 and the third heat dissipation component 240, respectively, to ensure normal operation.

The material of the first thermal adhesive sheets 220 in this embodiment is the aforementioned heat-sensitive adhesive, which has excellent adhesive quality, electrical insulation and thermal conductivity and is conducive to save production time. The two first thermal adhesive sheets 220 are respectively disposed between the second surface 232 of the second heat dissipation component 230 and the first surface 211 of the first heat dissipation component 210, and between the third surface 243 of the third heat dissipation component 240 and the first surface 211 of the first heat dissipation component 210. Since the first thermal adhesive sheets 220 provide bonding for the entire surface area and uniform adhesion, and no gaps are formed, the first heat dissipation component 210 is nicely fixed to the heat dissipation component 230 and the third heat dissipation component 240.

In other words, in addition to their own heat dissipation capability, the second heat dissipation component 230 and the third heat dissipation component 240 may further dissipate heat through the first heat dissipation component 210, thereby improving the heat dissipation performance of the heat dissipation module 20.

In addition, the area of the first thermal adhesive sheet 220 is greater than the projection area of the second surface 232 of the second heat dissipation component 230 on the first surface 211 of the first heat dissipation component 210, or/and the area of the first thermal adhesive sheet 220 is larger than the projection area of the third surface 243 of the third heat dissipation component 240 on the first surface 211 of the first heat dissipation component 210, so that the first thermal adhesive sheet 220 is well disposed between the second heat dissipation component 230 and the first heat dissipation component 210 and between the third heat dissipation component 240 and the first heat dissipation component 210, and thus good bonding is ensured.

Figure 4:
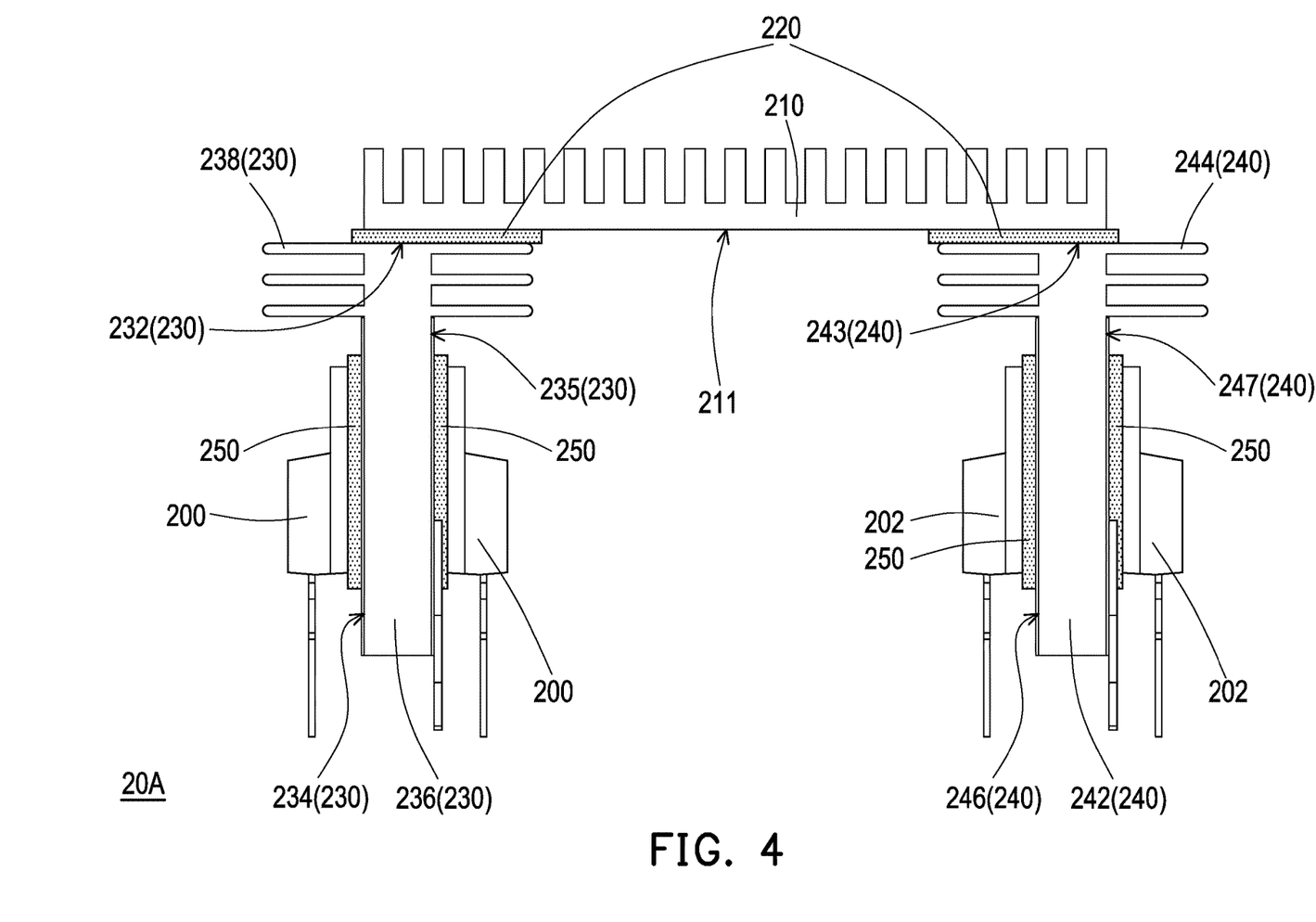
FIG. 4 is a side view of a heat dissipation module according to another embodiment of the disclosure.

FIG. 4 is a side view of a heat dissipation module according to another embodiment of the disclosure. A main difference between the embodiment shown in FIG. 4 and the embodiment shown in FIG. 3B is that the heat dissipation module 20A in FIG. 4 further includes a plurality of second thermal adhesive sheets 250, and the first electronic component 200 and the second electronic component 202 are fixed on the second heat dissipation component 230 and the third heat dissipation component 240, respectively, through the second thermal adhesive sheets 250.

Specifically, one of the second thermal adhesive sheets 250 is disposed on at least one of the fourth surface 234 and the fifth surface 235 of the first plate body 236 of the second heat dissipation component 230, so as to fix the first electronic component 200 to the second heat dissipation component 230. Another one of the second thermal adhesive sheets 250 is disposed on at least one of the sixth surface 246 and the seventh surface 247 of the second plate body 242 of the third heat dissipation component 240. Since the second thermal adhesive sheet 250 provides bonding for the entire surface area and uniform adhesion, and no gaps are formed, the second electronic component 202 is nicely fixed to the third heat dissipation component 240.

That is, the first electronic component 200 and the second electronic component 202 are fixed to the second heat dissipation component 230 and the third heat dissipation component 240 with the second thermal adhesive sheets 250, without generating metal shavings or burrs during the fixation process, so good electrical properties of the first electronic component 200 and the second electronic component 202 are ensured. Meanwhile, the heat dissipation performance of the second heat dissipation component 230 and the third heat dissipation component 240 is not affected since there is no issue of improper tightening.

In summary, the first heat dissipation component of the heat dissipation module in the disclosure is fixed to the electronic component through the first thermal adhesive sheet. The first thermal adhesive sheet provides bonding for an entire surface area, uniform adhesion, large adhesive area and thus great fixation. Moreover, no metal shavings or burrs will be produced during the fixation process, and improper tightening seen in conventional locking methods can be avoided, thereby ensuring normal electrical properties and heat dissipation performance of the heat dissipation module. Further, compared with conventional liquid glue dispensing, the fixation process of the first thermal adhesive sheet in the disclosure saves time and is conducive to mass production. Furthermore, the second heat dissipation component and the third heat dissipation component in the heat dissipation module are firmly fixed to the first heat dissipation component through the first thermal adhesive sheet, so that the first electronic component disposed on the second heat dissipation component and the second electronic component disposed on the third heat dissipation component dissipate heat through not only the second heat dissipation component and the third heat dissipation component but the first heat dissipation component, thus improving the heat dissipation performance of the heat dissipation module.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A heat dissipation module, comprising:
a first heat dissipation component, having a first surface;
a second heat dissipation component, comprising a first plate body and a plurality of first fins protruding from the first plate body, wherein one of the first fins has a second surface facing the first surface;
a third heat dissipation component, comprising a second plate body and a plurality of second fins protruding from the second plate body, wherein one of the second fins has a third surface facing the first surface; and
two first thermal adhesive sheets, respectively disposed between the second surface of the second heat dissipation component and the first surface of the first heat dissipation component and between the third surface of the third heat dissipation component and the first surface of the first heat dissipation component, so as to fix the first heat dissipation component to the second heat dissipation component and the third heat dissipation component.

2. The heat dissipation module according to claim 1, further comprising at least one first electronic component and at least one second electronic component, wherein the first plate body of the second heat dissipation component has a fourth surface and a fifth surface opposite to each other, and the second plate body of the third heat dissipation component has a sixth surface and a seventh surface opposite to each other, the at least one first electronic component is disposed on at least one of the fourth surface and the fifth surface, and the at least one second electronic component is disposed on at least one of the sixth surface or the seventh surface.

3. The heat dissipation module according to claim 2, further comprising a plurality of second thermal adhesive sheets, wherein one of the second thermal adhesive sheets is disposed on at least one of the fourth surface and the fifth surface of the first plate body of the second heat dissipation component, so as to fix the at least one first electronic component to the second heat dissipation component, another one of the second thermal adhesive sheets is disposed on at least one of the sixth surface and the seventh surface of the second plate body of the third heat dissipation component, so as to fix the at least one second electronic component to the third heat dissipation component.

4. The heat dissipation module according to claim 2, wherein at least one of the first electronic component and the second electronic component is a chip.

5. The heat dissipation module according to claim 2, wherein at least one of the first electronic component and the second electronic component is a capacitance component or an inductance component.

6. The heat dissipation module according to claim 1, an area of the first thermal adhesive sheet is greater than a projection area of the second surface of the second heat dissipation component on the first surface of the first thermal dissipation component, or/and the area of the first thermal adhesive sheet is greater than a projection area of the third surface of the third heat dissipation component on the first surface of the first heat dissipation component.

7. The heat dissipation module according to claim 1, wherein a thickness of the first thermal adhesive sheet is between 0.02 mm and 0.2 mm.

\* \* \* \* \*